US009373576B2

(12) United States Patent
Tsang

(10) Patent No.: US 9,373,576 B2
(45) Date of Patent: Jun. 21, 2016

(54) FLIP CHIP PAD GEOMETRY FOR AN IC PACKAGE SUBSTRATE

(71) Applicant: Broadcom Corporation, Irvine, CA (US)

(72) Inventor: Kwok Cheung Tsang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 109 days.

(21) Appl. No.: 14/151,506

(22) Filed: Jan. 9, 2014

(65) Prior Publication Data

US 2015/0194378 A1 Jul. 9, 2015

(51) Int. Cl.
*H01L 29/40* (2006.01)
*H01L 23/498* (2006.01)
*H01L 21/48* (2006.01)
*H05K 3/40* (2006.01)
*H05K 3/02* (2006.01)

(52) U.S. Cl.
CPC ........ *H01L 23/49838* (2013.01); *H01L 21/486* (2013.01); *H01L 21/4857* (2013.01); *H01L 23/49822* (2013.01); *H01L 23/49827* (2013.01); *H05K 3/02* (2013.01); *H05K 3/4038* (2013.01); *H01L 2224/81* (2013.01); *H05K 2203/0361* (2013.01); *H05K 2203/0703* (2013.01); *Y10T 29/49155* (2015.01); *Y10T 29/49156* (2015.01)

(58) Field of Classification Search
CPC ..................... H01L 21/67121; H01L 23/3114; H01L 24/01; H01L 33/48
See application file for complete search history.

(56) References Cited

U.S. PATENT DOCUMENTS

| | | | |
|---|---|---|---|
| 6,495,442 B1 * | 12/2002 | Lin | ........................ H01L 21/768 257/E21.575 |
| 2008/0191345 A1 | 8/2008 | Na et al. | |
| 2011/0018144 A1 | 1/2011 | Horiuchi et al. | |
| 2011/0074041 A1 | 3/2011 | Leung et al. | |

OTHER PUBLICATIONS

European Search Report directed to related EP Application No. 14004261.5, dated May 22, 2015, mailed from the European Patent Office; 3 pages.

* cited by examiner

*Primary Examiner* — Elias M Ullah
(74) *Attorney, Agent, or Firm* — Sterne, Kessler, Goldstein & Fox P.L.L.C.

(57) ABSTRACT

An integrated circuit (IC) package substrate is provided. In one embodiment, the IC package substrate includes a dielectric layer having first and second opposing surfaces and a matrix of pillars disposed in the dielectric layer and arranged to receive a matrix of conductive elements of an IC die. Each pillar of the matrix of pillars is exposed at the first surface of the dielectric layer. Each pillar of the matrix of pillars extends through the dielectric layer to contact a metal layer attached to the second surface of the dielectric layer.

18 Claims, 18 Drawing Sheets

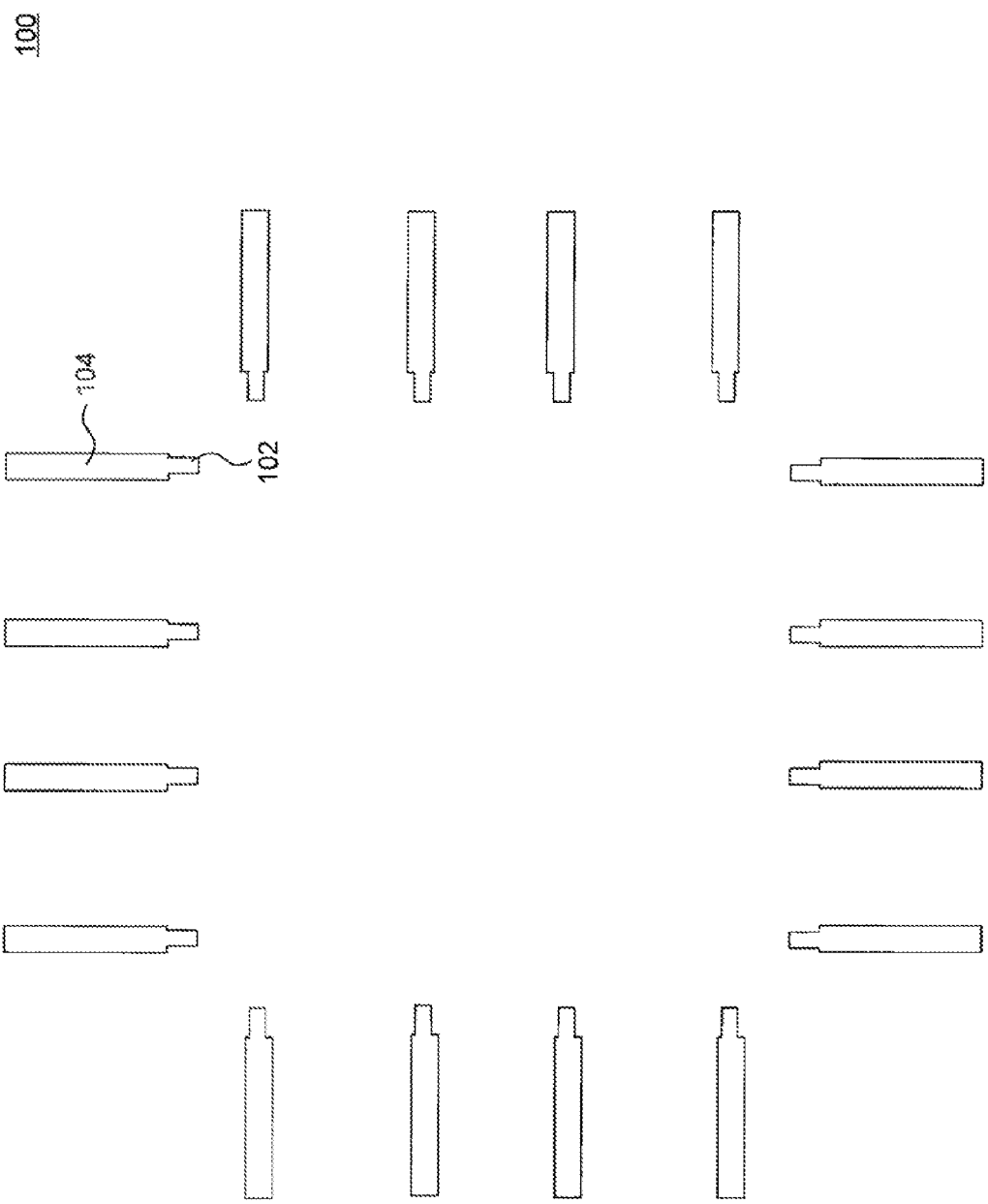
FIG. 1
Conventional

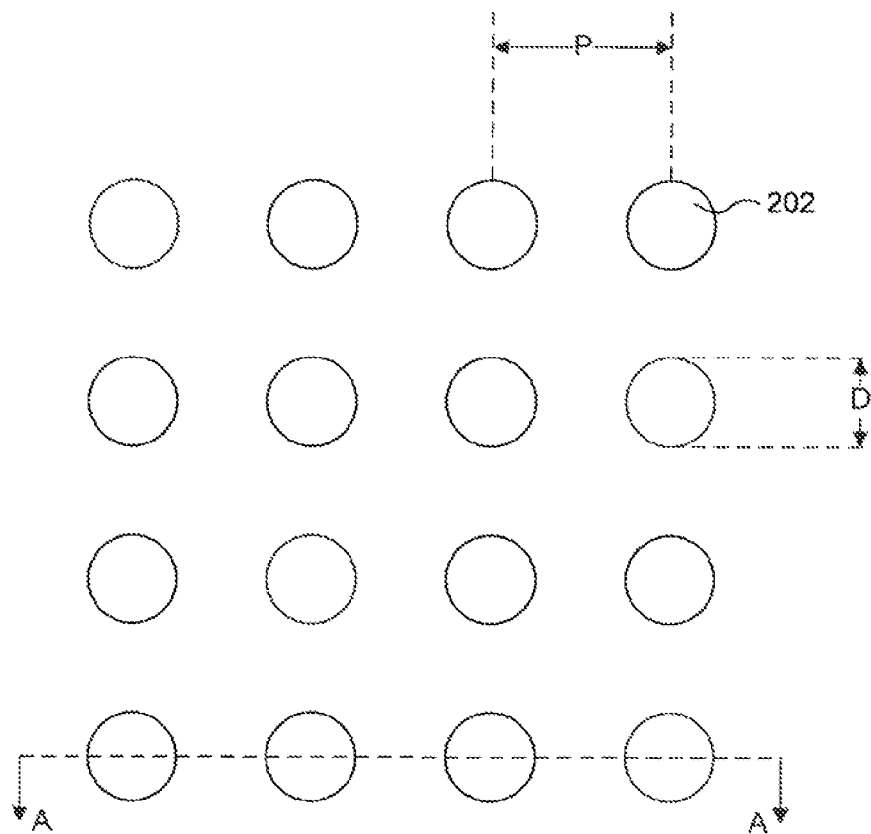
FIG. 2
Conventional

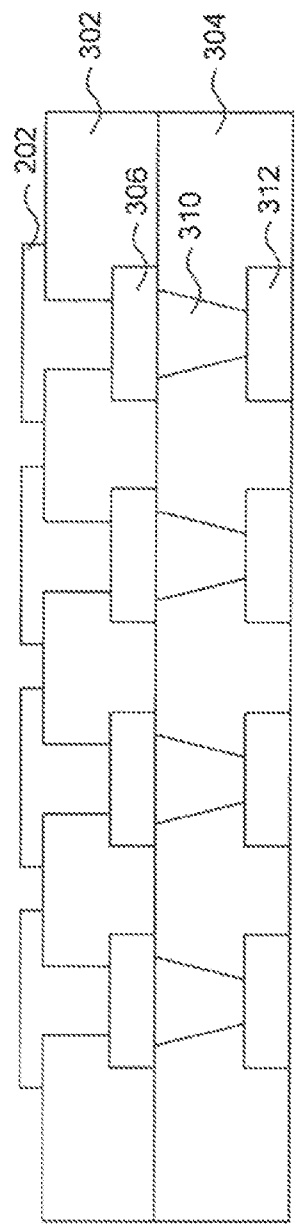
FIG. 3
Conventional

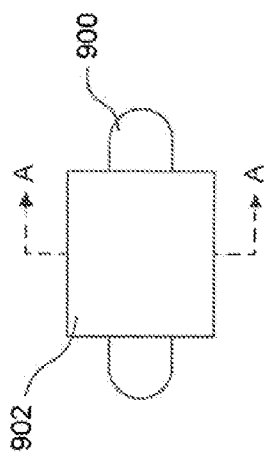
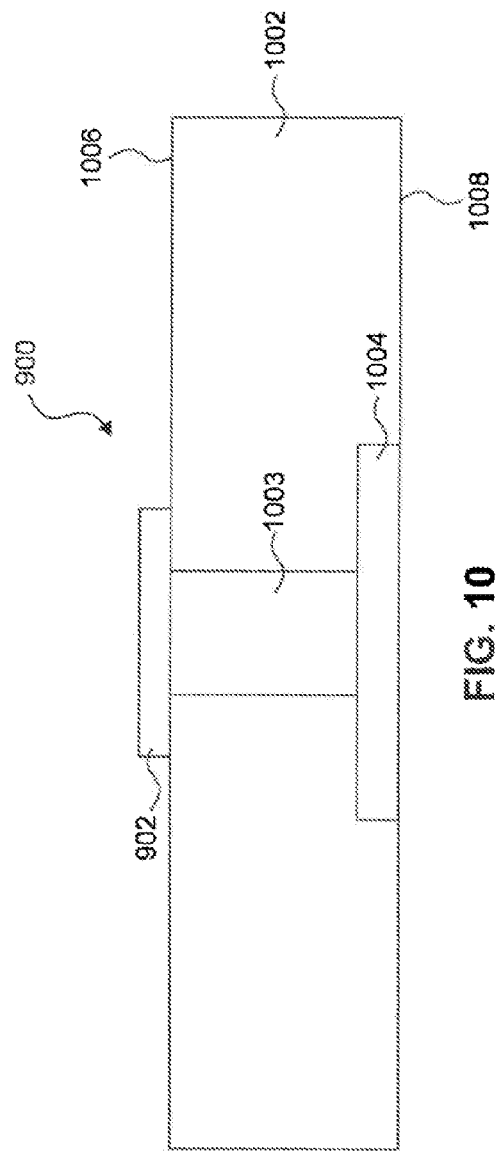

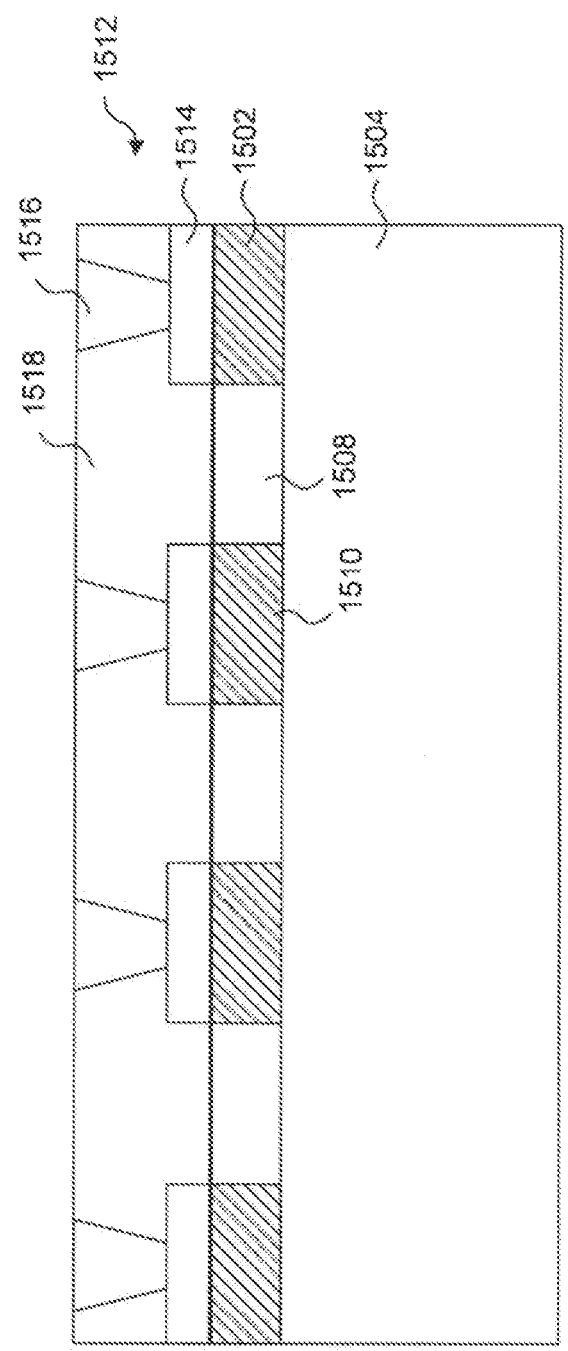

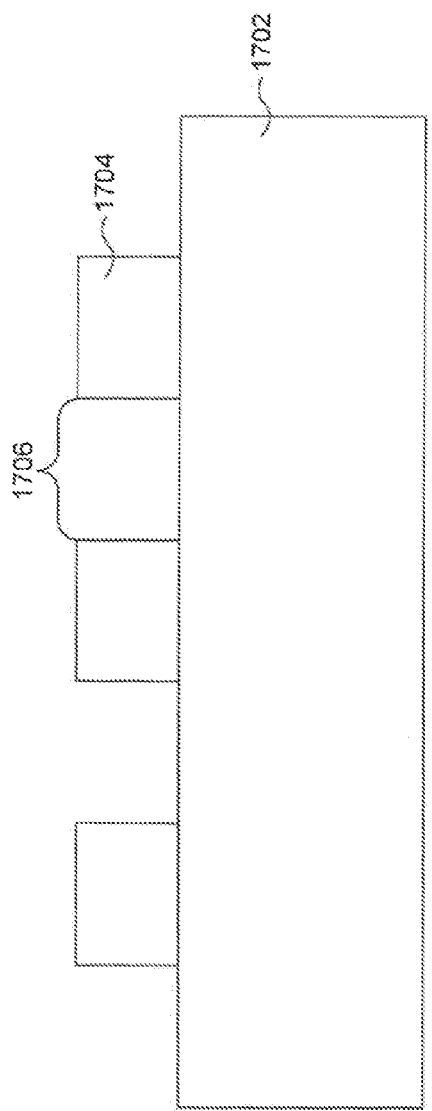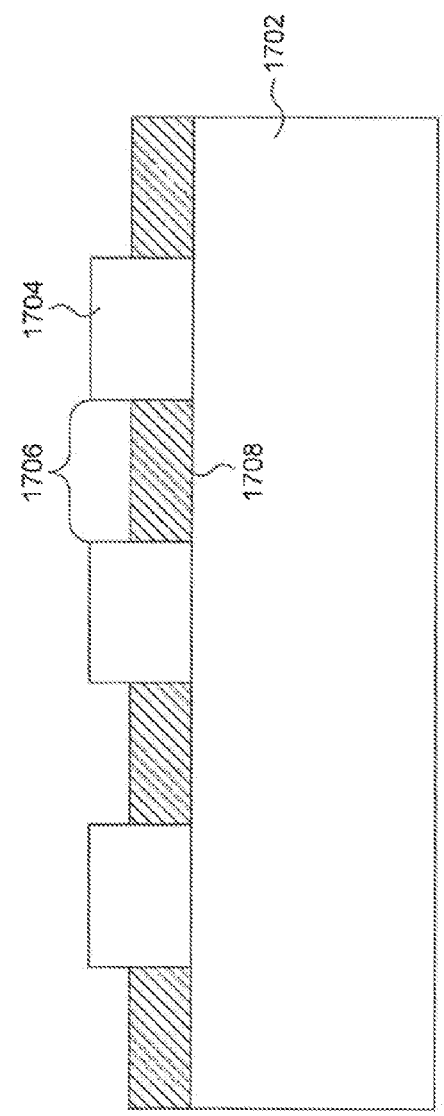

FLIP CHIP PAD GEOMETRY FOR AN IC PACKAGE SUBSTRATE

BACKGROUND

1. Field

The present disclosure generally relates to substrates for electronic devices, including substrates for use in integrated circuit packages.

2. Background Art

Integrated circuit (IC) devices can include an IC die that is included in an IC package. The IC die can be formed out of silicon and can have circuits formed therein. The IC package can include an IC package substrate to which the IC die is mounted. One configuration for mounting an IC die to an IC package substrate is a flip-chip configuration in which the active surface of the IC die faces the IC package substrate. In this configuration, conductive elements of the IC die can be used to couple the IC die to conductive pads on the IC package substrate. For example, the conductive elements can include solder bumps that be attached to pads of the IC package substrate using a reflow process. In a solder reflow process, the IC die can be pressed against the IC package substrate and heated in a reflow oven such that the solder melts. After the solder cools, connections are formed between the IC die's conductive elements and the IC package substrate's pads. The IC package substrate can further include pads on the opposite surface as the IC die, which can be used to couple the IC device to a printed circuit board (PCB), e.g., through pins or solder balls.

In one implementation, the IC die can have conductive elements formed along the periphery of its active surface. In this implementation, the IC package substrate can include pads formed in a bond on lead (BoL) configuration. When the pads are in a BoL configuration, connections from the IC die are routed to other locations on the IC package substrate using traces arranged in a "fan out" pattern or a "fan in" pattern. A BoL configuration may not be suitable for an IC die that includes connection elements throughout its active surface in a matrix configuration, because the interior traces would intersect with other traces. In another configuration, the IC package substrate includes a matrix of pads, each of which is coupled to another layer of the IC package substrate through, e.g., a via. Conventional substrates that include a matrix of pads, however, can be expensive to manufacture because they require an expensive solder on pad (SOP) process to couple the conductive elements to the IC package substrate's pads.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

FIG. 1 shows a top view of an integrated circuit (IC) package substrate having a conventional Bond on Lead (BoL) configuration.

FIG. 2 shows a top view of an IC package substrate having a conventional solder on pad (SOP) configuration.

FIG. 3 shows a cross-sectional view of the IC package substrate shown in FIG. 2.

FIG. 9 shows a top view of a pillar, according to an embodiment.

FIG. 10 shows a cross-sectional view of the pillar shown in FIG. 9, according to an embodiment.

FIGS. 15A-15F illustrate manufacturing steps for a method of manufacturing a matrix of pillars of an IC package substrate, according to an embodiment.

FIGS. 17A-17B illustrate manufacturing steps for a method of manufacturing a matrix of pillars of an IC package substrate, according to an embodiment.

Figure 4:
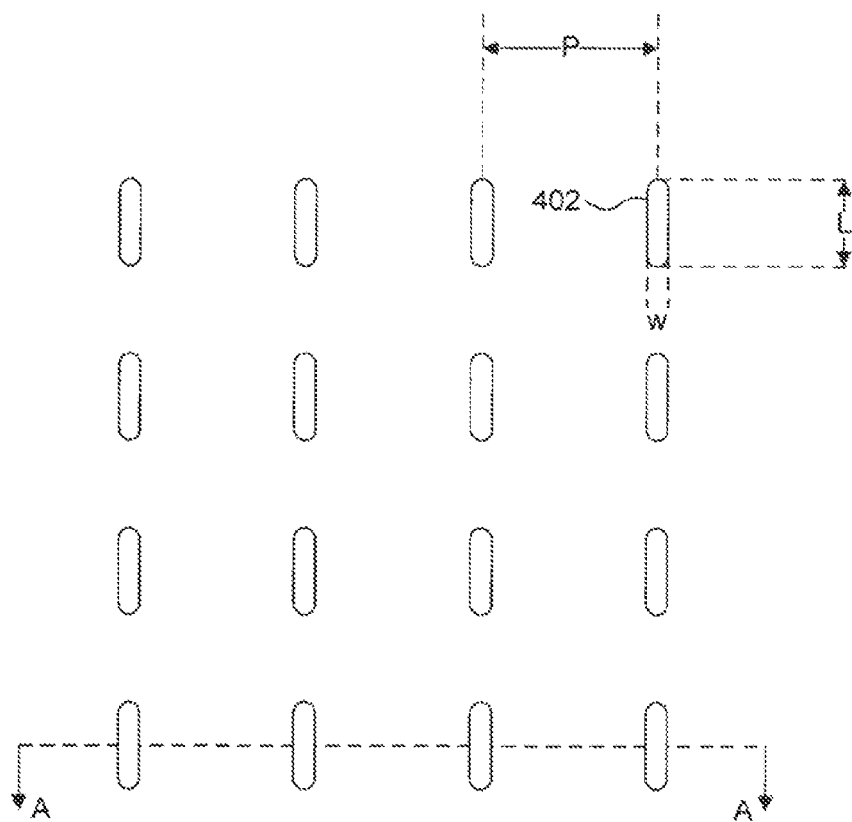
FIG. 4 shows a top view of an IC package substrate having a matrix of pillars, according to an embodiment.

The present disclosure will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

FIG. 1 shows a top view of a conventional substrate 100. Substrate 100 includes pads 102 and traces 104. The pattern shown in FIG. 1 is referred to as a "bump-on-lead" (BOL) configuration. Pads 102 are arranged to receive conductive elements from an integrated circuit (IC) die. For example, pads 102 can be arranged to receive bumps or wire bonds from an IC die that is to be mounted on substrate 100. Traces 104 route each respective pad 102 to other locations on the IC package substrate 100. For example, traces 104 can be used to couple the IC die to other components mounted on substrate 100. In another example, traces 104 can be electrically coupled to vias which can be used to couple the pads 102 to the bottom surface of IC package substrate 100, e.g., for coupling to package level connection elements, e.g., pins or solder balls.

Pads 102 and/or traces 104 can be formed out of a variety of different conductive materials used in IC package substrate manufacture known to those having ordinary skill in the art (e.g., copper or aluminum). In one implementation, pads 102 can be implemented as short, narrow traces. Thus, pads 102 and traces 104 can be formed using the same manufacturing process. For example, pads 102 and traces 104 can be formed by etching a metal layer (e.g., using a chemical etchant, using a mechanical etching, or lithographic etching).

IC dies can have conductive elements formed only on a periphery of the active surface of an IC die. For example, a "flip chip" die can have solder bumps formed on the periphery of the IC die's active surface. A BoL configuration can be used for IC dies having conductive elements formed only on their periphery. For example, as shown in FIG. 1, pads 102 and traces 104 are arranged to "fan out" connections from the IC die. Because different ones of traces 104 do not intersect in such a fan out configuration, the routing of the IC dies connections to other locations on the IC package substrate can be done in a single metal layer.

A BoL configuration cannot, however, be used for flip chip IC dies that have a matrix of conductive elements on their active surface. Because pads 102 would have to be arranged in a matrix configuration, a fan out configuration or a fan-in configuration may not effectively route connections to other locations of the IC package substrate. In particular, traces emanating from inner pads of the array of pads may intersect with other traces of the IC package substrate. For example, traces emanating from a pad in a matrix of pads may intersect with pads emanating from adjacent pads.

In addition, vias cannot be provided below pads 102 in a BoL configuration to allow for the use of multiple layers to route connections. For example, vias typically need larger pads than the size of pads 102 available in BoL configurations. Moreover, pads 102 making pads 102 large enough to allow for vias to be formed underneath them can result in less reliable wetting between the IC die's conductive elements and pads 102. In particular, the IC die's conductive elements can be coated with solder that is sufficient to wet with the relatively small pads 102 used in a BoL configuration. Lager pads, however, may require more solder than what is provided in the conductive elements for effective wetting between the conductive elements and the pads, thereby resulting in unreliable connections between the conductive elements and the pads.

The above description of conventional substrate 100 has referred to "fan-out" arrangements. Conventional substrates having "fan-in" arrangements suffer from similar drawbacks. In particular, in fan-in arrangements, traces are routed from the edge of an IC die to the center of an IC package substrate. Similar to fan-out arrangements, fan-in arrangements cannot be used for IC dies that have a matrix of conductive elements because traces coupled to outer conductive elements may intersect with trances coupled to inner conductive elements of the IC die.

FIG. 2 shows a top view of an IC package substrate 200. FIG. 3 shows a cross-sectional view along line A of IC package substrate 200. As shown in FIG. 2, IC package substrate 200 includes a matrix of pads 202. The diameter, D, of each of pads 202 can be approximately 105 µm. The pitch, P, of IC package substrate 200 can be approximately 135 µm. Pads 202 can be arranged to receive conductive elements from an IC die. For example, pads 202 can be configured to receive conductive bumps from an IC die. The bump pattern of the IC die can be a matrix pattern.

As noted above, when a flip chip IC die has conductive elements arranged in a matrix configuration on its active surface, the IC package substrate onto which the IC die is mounted may need multiple conductive layers to route the connections of the IC die. As shown in FIG. 3, each pad 202 is coupled to a respective pad 306. Pads 306 are disposed within dielectric layer 302. For example, dielectric layer 302 can be a solder mask. Pads 306 can be part of a patterned metal layer used to route connections of an IC die. Because pads 306 are included in the top-most metal layer of IC package substrate 200, they can be referred to as "L1" pads (e.g., level 1 pads). To provide for additional routing capabilities so that connections do not intersect, IC package substrate 200 includes a second level of routing. For example as shown in FIG. 3, IC package substrate 200 includes pads 312. Pads 312 can be part of a second patterned metal layer that is used to route connections from the IC die. Because pads 312 are included in the second highest metal layer of IC package substrate 200, they can be referred to as "L2" pads (e.g., level 2 pads). Pads 306 are coupled to pads 312 through vias 310. Thus, multiple levels of routing can be provided so that connections from the IC die can be routed to appropriate locations on IC package substrate 200.

Although the pad layout of IC package substrate 200 allows for routing of connections of from IC dies that have matrices of connection elements, the manufacturing of IC package substrate 200 can be relatively expensive. In particular, conductive elements of an IC die are typically coated with solder, which is sufficient for wetting the conductive element to a pad on the IC package substrate when the pad has a relatively small surface area. When the pad has a larger surface area, e.g., a surface area sufficient to allow for a via to be formed underneath the pad, additional solder is needed to reliably join the conductive element and the pad. Thus, pads 202 can be formed used a solder on pad (SOP) process. For example, pads 202 can be formed by dropping micro solder balls into openings formed in dielectric layer 302. However, the micro solder balls cannot be attached using conventional screen printing techniques. Thus, IC package substrate 200 can be expensive to manufacture.

Exemplary Embodiments

In embodiments described herein, an IC package substrate is provided that includes a matrix of pillars. The matrix of pillars can be used to route connections of an IC die without requiring the use of an expensive SOP process. For example, each of the matrix of pillars can be coupled to a respective pad of a metal layer of the IC package substrate, and the respective pad can be coupled to a respective via.

In one example, each of the pillars can have a substantially uniform cross-section. Each of the pillars can also be formed out of a solid metallic material that is coated or plated. An exposed surface of each pillar can have a substantially oval or oblong shape. This oval or oblong shape, by virtue of its relatively small surface area, can facilitate wetting to conductive elements of an IC die without requiring additional solder, e.g., using SOP.

The matrix of pillars can be formed by etching a metal layer to create patterns, laminating the matrix of pillars with a dielectric material, and grinding the laminated material to expose a surface of each pillar. The matrix of pillars can extend from the top surface of the dielectric material to the bottom surface of the dielectric material and contact pads of a patterned metal layer, e.g., L1 pads. In another embodiment, the matrix of pillars can be formed by forming openings in a dielectric material (e.g., using a laser) filling the openings with metal, and etching the metal material such that the surface of the substrate is substantially planar.

Figure 5:
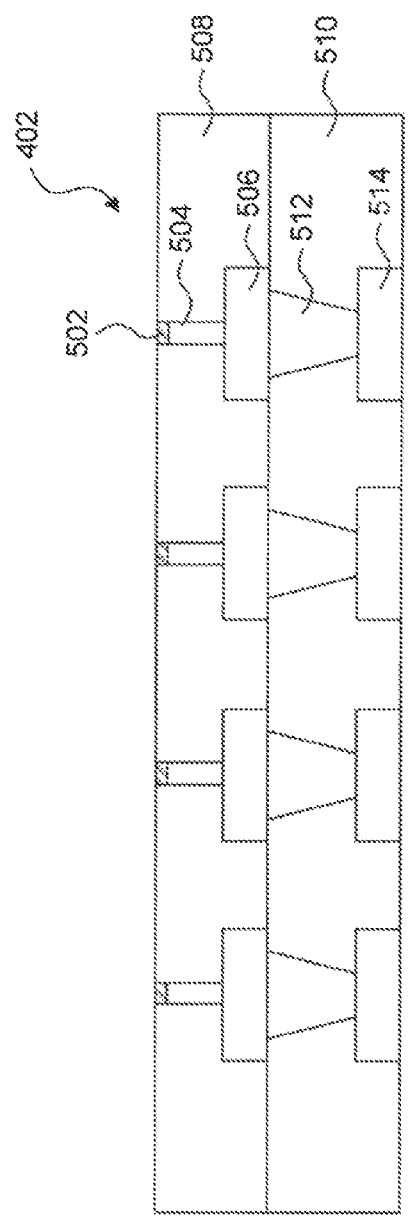
FIG. 5 shows a cross-sectional view of the IC package substrate shown in FIG. 4, according to an embodiment.

FIG. 4 shows a top view of an IC package substrate 400, according to an embodiment. FIG. 5 shows a cross-sectional view of IC package substrate 400 along line A. As shown in FIG. 4, IC package substrate 400 includes a matrix of pillars 402. Pillars 402 can be arranged to receive respective ones of conductive elements of an IC die. The pitch, P, between pillars 402 can be sized so as to match the pitch between conductive elements of an IC die. Each of pillars 402 can be bonded to a respective one of the conductive elements of an IC die using, for example, a solder reflow process.

As shown in FIG. 4, each of pillars 402 has a length L and a width W. In an embodiment, the length L of each pillar 402 is approximately 105 µm and the width W of each pillar 402 is approximately 25-30 µm. Thus, in the aspect ratio of each of pillars 402, i.e., the ratio between the length and width of each of pillars 402, can be on the order of 3:1. More generally, aspect ratios of x:y can be used where x>y. A relatively high aspect ratio can facilitate bonding to conductive elements of an IC die because the relatively small surface area does not require additional solder beyond what is coated to on the conductive elements to facilitate wetting between the conductive elements and pillars 402.

As shown in FIG. 5, each of pillars 402 includes a coating 502 and a solid metallic portion 504. Exemplary structures for pillars 402 will be described in greater detail below with respect to FIGS. 6-10. Each of pillars 402 is electrically connected to a respective one of pads 506. For example, as shown in FIG. 5, each of pillars 402 can physically contact a respective one of pads 506. Pads 506 can be included in a top-most metal layer of IC package substrate 400. Thus, pads 506 can be L1 pads. Pads 506 can be a part of a patterned metal layer that is used to route connections from the IC die to other locations on substrate 400.

As shown in FIG. 5, pillars 402 are disposed in a dielectric layer 508. In an embodiment, dielectric layer 508 is a dielectric film laminate. For example, dielectric layer 508 can be an HBI film provided by Taiyo, Inc. In alternate embodiments, other types of dielectric films can be used for dielectric layer 508. For example, dielectric layer 508 can be a solder mask, e.g., an AUS 410 solder mask provided by Taiyo, Inc., an ABF GX13 insulating film provided by Ajinomoto Fine-Techno Co., Inc., or an ABF GX92 insulating film provided by Ajinomoto Fine-Techno Co., Inc.

As shown in FIG. 5, dielectric layer 508 contacts dielectric layer 510. Dielectric layer 510 can be a conventional substrate dielectric layer, e.g., a conventional prepreg material, or an insulating film, e.g., an ABF GX13 insulating film provided by Ajinomoto Fine-Techno Co., Inc., or an ABF GX92 insulating film provided by Ajinomoto Fine-Techno Co., Inc. As shown in FIG. 5, each of pads 506 is connected to a respective via 512. Vias 512 can be filled vias, e.g., vias that are filled with a conductive material such as copper, or plated vias, e.g. vias that are hollow and plated with a conductive material. Each of vias 512 contact a respective one of pads 514. Pads 514 can be part of a patterned metal layer. This additional patterned metal layer can provide additional routing resources for routing connections of the IC die to other locations on IC package substrate 400. As shown in FIG. 5, pads 514 are included in the second highest layer metal layer of IC package substrate 400 and can be L2 pads. Thus, IC package substrate 400 can allow for multiple layers of routing resources to route connections from an IC die to other locations of the IC package substrate without requiring an expensive SOP process to facilitate wetting with the IC die.

Figure 6:
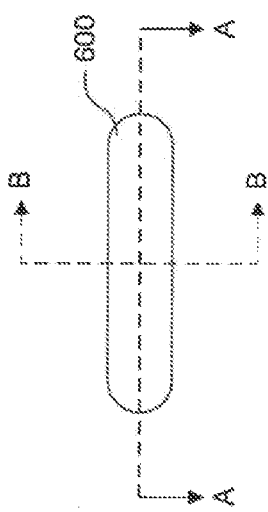
FIG. 6 shows a top view of a pillar, according to an embodiment.
Figure 7:
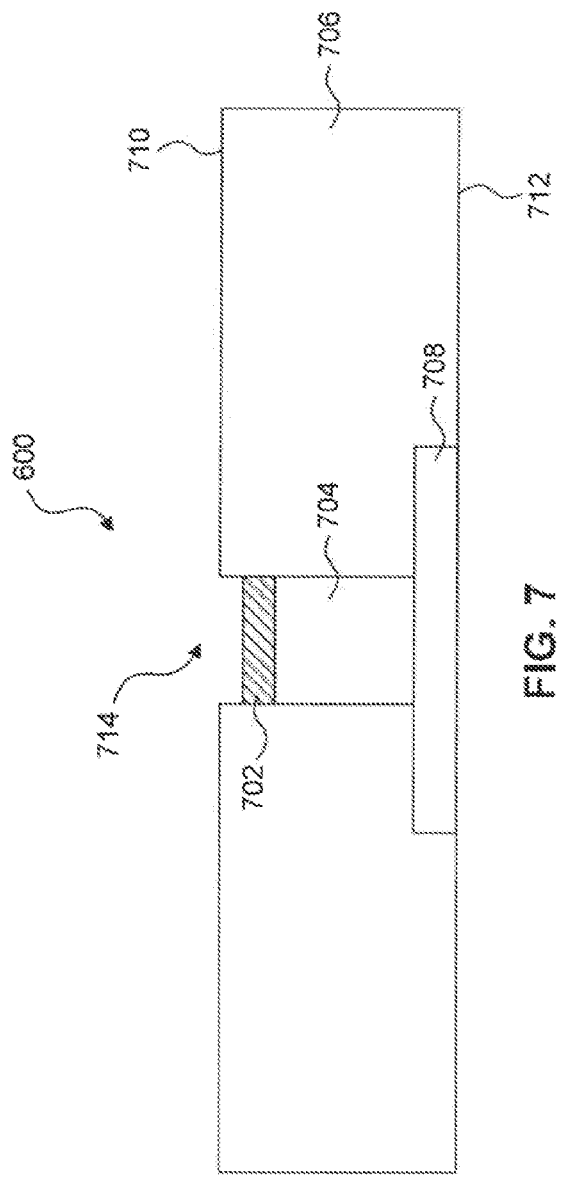
FIGS. 7 and 8 show cross-sectional views of the pillar shown in FIG. 6, according to embodiments.
Figure 8:
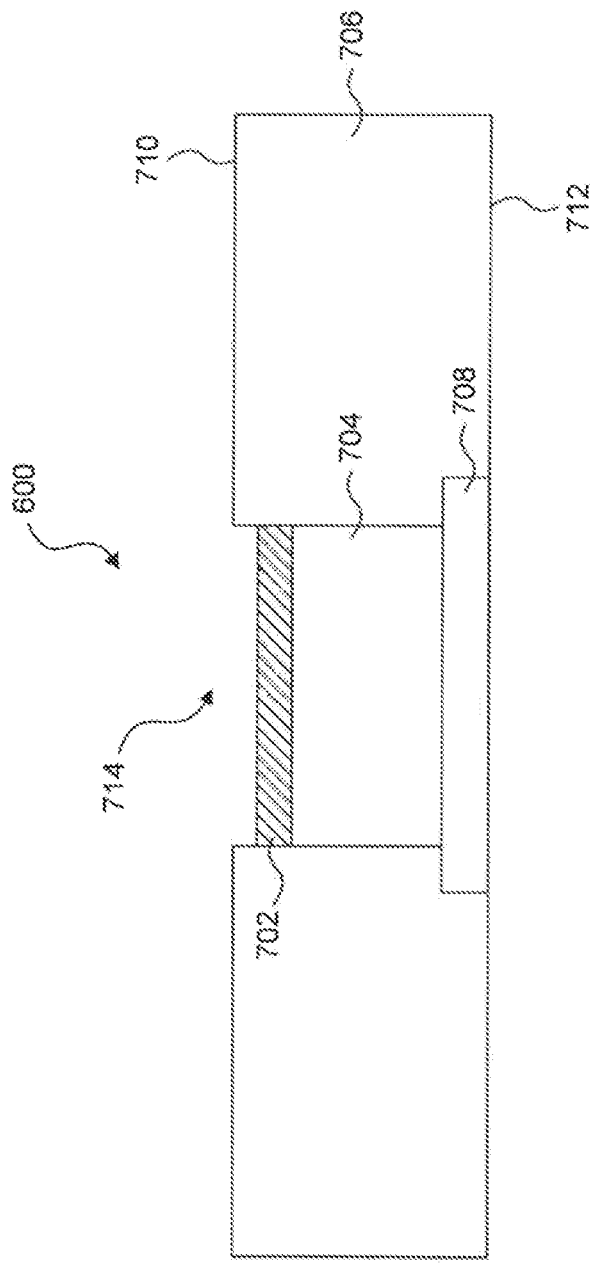

FIG. 6 shows a top view of a pillar 600, according to an embodiment. As shown in FIG. 6, the exposed surface of pillar 600 has a substantially oblong or oval shape. FIG. 7 shows a cross-sectional view of pillar 600 along line B and FIG. 8 shows a cross-sectional view of pillar 600 along line B. As shown in FIG. 7, pillar 600 includes a coating 702, and a solid metallic portion 704. Solid metallic portion 704 physically contacts a pad 708. Pad 708 can be included in the top-most metal layer of the IC package substrate and can thus may be an L1 pad. Pillar 600 is disposed in a dielectric layer 706. Dielectric layer 706 can be a dielectric film such as the HBI film provided by Taiyo, Inc.

As shown in FIG. 7, a dielectric layer 706 has a first surface 710 and a second surface 712. First surface 710 has a dimple that exposes coating. The depth of dimple 714 can be, for example, approximately 3 µm or less. Dimple 714 can facilitate coupling between pillar 600 and a conductive element of an IC die during a solder reflow process. In alternate embodiments, surface 710 may not include a dimple 714. In such an embodiment, first surface 710 of dielectric layer 706 is substantially planar.

Solid metallic portion 704 is coated with a coating 702. In an embodiment, coating 702 can be an organic surface passivation (OSP) material. The OSP material can be a water-based material that prevents oxidation of solid metallic portion 704. In alternate embodiments, coating 702 can be omitted. In such an embodiment, solid metal portion 704 is exposed at first surface 710 of dielectric material 706.

Solid metallic portion 704 can be formed out of one of a variety of different types of metallic materials used to form traces and other features in substrates. For example, solid metallic portion 704 can be formed out of copper or aluminum. As described in further detail below, solid metallic portion 704 can be formed by etching a copper layer. Solid metal portion 704 extends from surface 710 to pad 708. Thus, solid metal portion 704 electrically couples the surface 710 to pad 708 to allow for routing of a connection from an IC die. As shown in FIG. 7, pillar 600 has a substantially uniform cross-section. Thus, pillars 600 can be formed as a prism that is disposed within dielectric layer 706.

FIG. 8 shows a cross-section of pillar 600 along line A shown in FIG. 6. As shown in FIG. 8, pillar 600 is substantially longer in the direction of cross-section line A than in line B. As noted above, this high aspect ratio can allow for enhanced wetting to conductive elements of an IC die.

FIG. 9 shows a top view of a pillar 900, according to an embodiment. As shown in FIG. 9, pillar 900 has a substantially oblong or oval shape. In addition, pillar 900 is plated with a plating material 902. FIG. 10 shows a cross-sectional view of pillar 900 along line A in FIG. 9. Plating material 902 can be used instead of or in addition to a coating, e.g., an OSP coating. Plating material 902 can include, for example, one or more of copper, nickel tin, or gold. In another embodiment, plating material 902 can be implemented using binary plating using binary alloys, such as a tin-gold (SnAg) alloy or a tin-copper (SnCu) alloy. Plating material 902 can be used to enhance wetting with conductive elements of the IC die.

As shown in FIG. 10, pillar 900 is disposed in dielectric layer 1002. Pillar 900 includes a solid metallic portion 1003 that contacts a pad 1004. Pad 1004 can be an L1 pad that is part a patterned metal layer. As shown in FIG. 10, both first and second surfaces 1006 and 1008 of dielectric layer 1002 are substantially planer. In addition, in the embodiment of FIG. 10, solid metallic portion 1003 of pillar 900 is exposed at first surface 1006 (without a coating). Plating material 902 is provided over top of this exposed solid metallic portion. In alternate embodiments, solid metallic portion 1003 can be coated, e.g., with an OSP coating.

Figure 11:
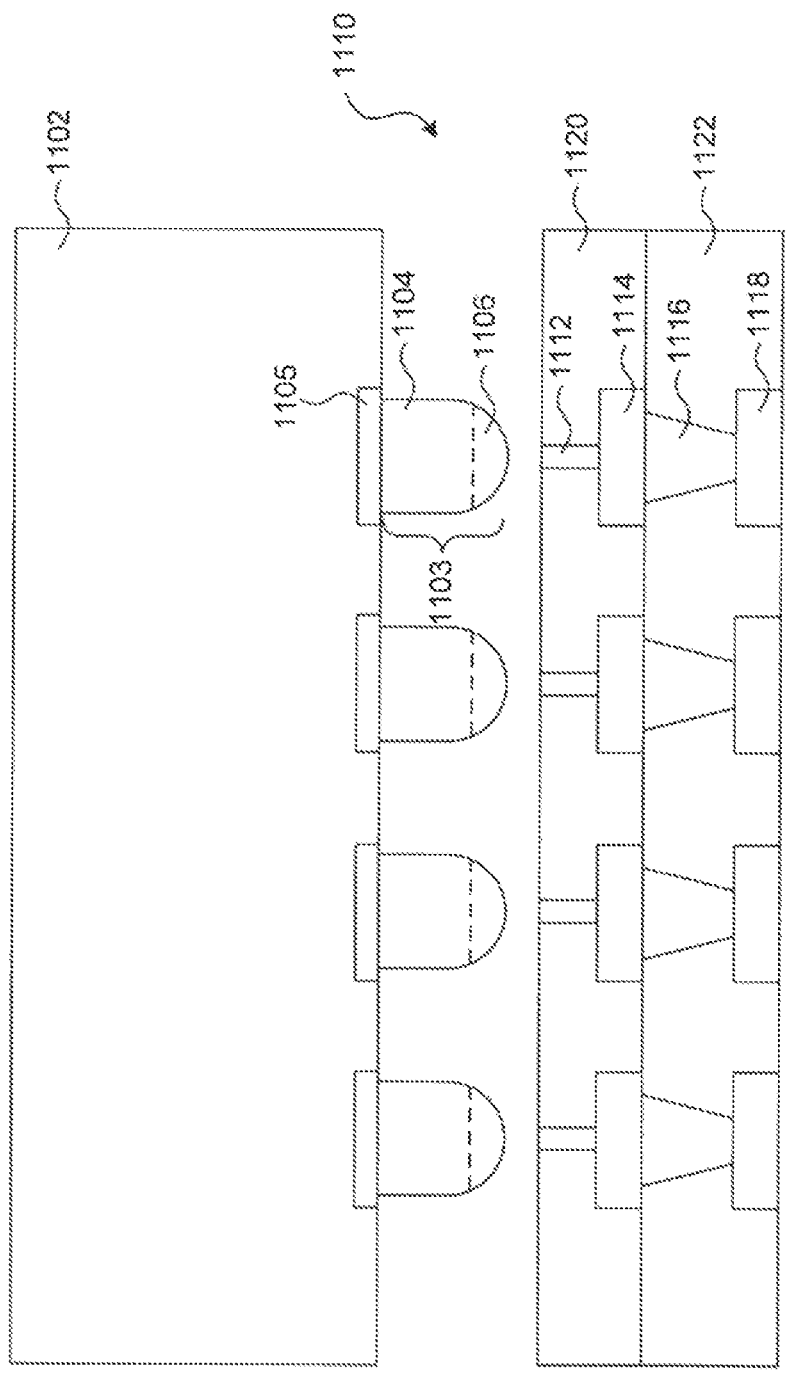
FIG. 11 shows a cross-sectional view of an IC die and an IC package substrate, according to an embodiment.

FIG. 11 shows a cross-sectional diagram illustrating an IC die 1102 and an IC package substrate 1110, according to an embodiment. As shown in FIG. 11, IC die 1102 includes conductive elements 1103 coupled to conductive pads 1105. Conductive elements 1103 include a post 1104 and a solder portion 1106. For example, conductive elements 1103 can be solder bumps in which each bump includes post 1104 coated with solder portion 1106. Posts 1104 can be formed out of a variety of different types of conductive materials, e.g., copper or aluminum. Solder portion 1106 can be used to facilitate a wetting between die 1102 and IC package substrate 1110. For example, in a reflow process, die 1102 can pressed onto substrate 1110. The combination can then be heated such that the solder melts and forms a connection between IC die 1102 and IC package substrate 1110.

As shown in FIG. 11, IC package substrate 1110 includes a matrix of pillars 1112, L1 pads 1114, vias 1116, and L2 pads 1118. Matrix of pillars 1112 and L1 pads 1114 are disposed in dielectric layer 1120. Dielectric layer 1120 can be a dielectric film, e.g., the HBI film provided by Taiyo, Inc. or a solder mask such as solder mask AUS 310 provided by Taiyo, Inc. Vias 1116 and pads 1118 are disposed in dielectric layer 1122. Dielectric layer 1122 can be a conventional substrate dielectric layer, e.g., a prepreg material.

As shown in FIG. 11, each of conductive elements 1103 of IC die 1102 is received by a respective one of the matrix of pillars 1112. Each of pillars 1112 couple the respective one of conductive elements 1103 to a respective L1 pad 1114. Each of L1 pads 1114 is electrically coupled to a respective one of L2 pads 1118 using a via 1116. Thus, in the embodiment of FIG. 11, IC package substrate 1110 provides two layers of routing resources to route connections from IC die 1102. Although the embodiment shown in FIG. 11 shows an IC package substrate 1110 having two metal layers, in alternate embodiments substrates having more than two metal layers can be used (e.g., four metal layers).

Figure 12:
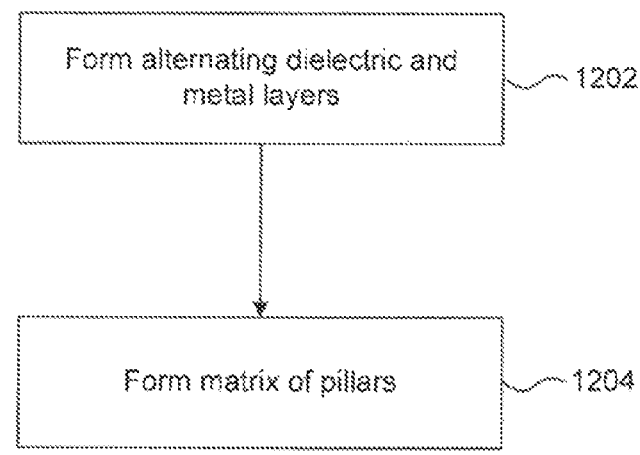
FIG. 12 shows a flowchart providing example steps for manufacturing an IC package substrate, according to an embodiment.

FIG. 12 shows a method of manufacturing an IC package substrate, according to an embodiment. Not all steps of method 1200 may be required, nor do all of the steps shown in FIG. 12 necessarily have to occur in the order shown.

In step 1202, alternating dielectric and metal layers are formed. An example of step 1202 is described in greater detail below with respect to FIG. 13. In step 1204, a matrix of pillars is formed. Step 1204 is described with greater detail with respect to FIGS. 14-17. As described in greater detail below, steps 1202 and 1204 can occur in any order. For example, the alternating dielectric and metal layers of an IC package substrate can first be formed and a matrix of pillars can be formed on this structure. Alternatively, the matrix of pillars can be formed on a manufacturing carrier and then the alternating layers of dielectric material and metal layers can be coupled to this matrix of pillars.

Figure 13:
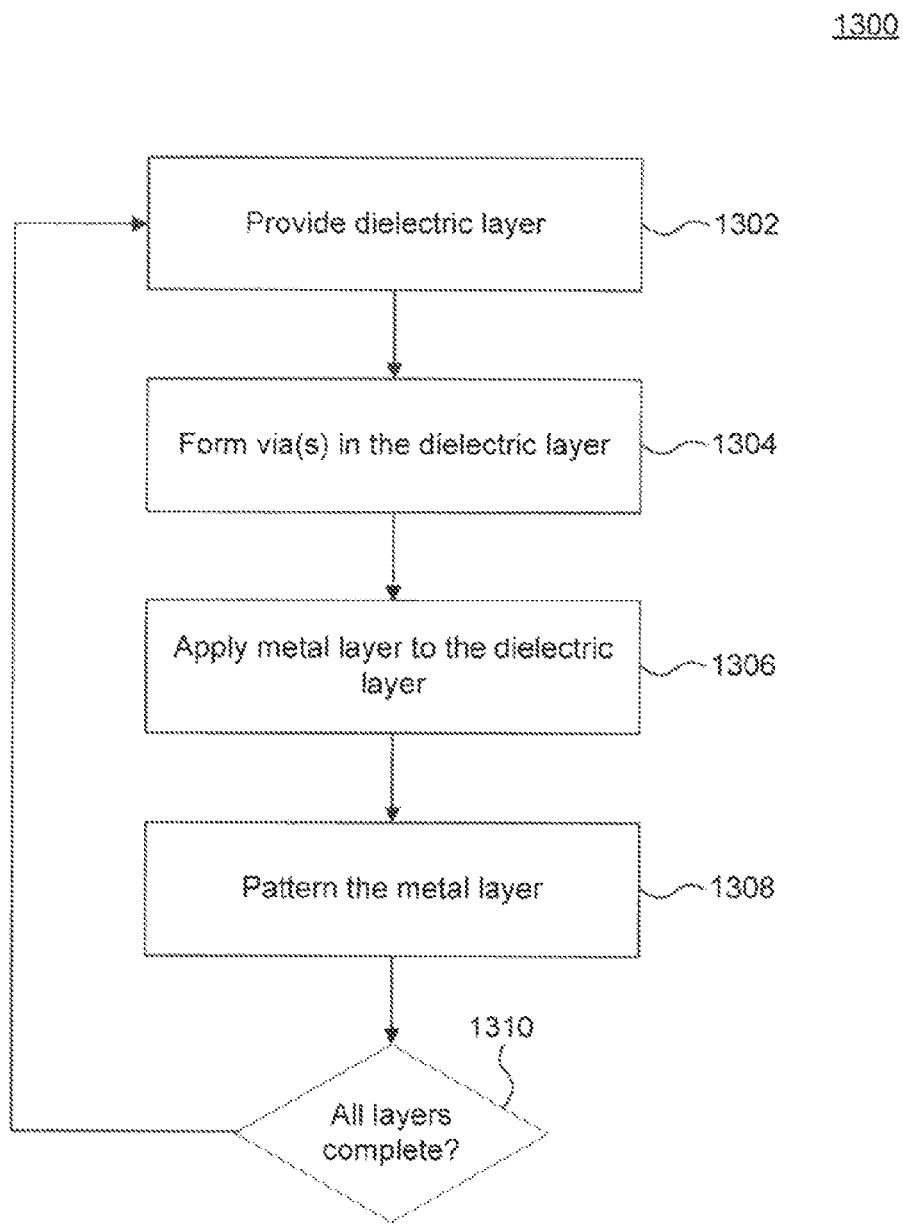
FIG. 13 shows a flowchart providing example steps for manufacturing alternating dielectric and metal layers of an IC package substrate, according to an embodiment.

FIG. 13 shows a method of manufacturing alternating metal layers and dielectric layers of an IC package substrate, according to an embodiment. Not all steps of method 1300 may be required, nor do all of these steps shown in FIG. 13 necessarily have to occur in the order shown.

In step 1302, a dielectric layer is provided. For example, a prepreg or other conventional dielectric layer used in substrate manufacture can be provided.

In step 1304, one or more vias can be formed in the dielectric layer. As noted above, vias can be either plated vias. e.g. vias that are hollow and plated with a conductive material, or filled vias, e.g., vias that are filled with a dielectric material. As would be appreciated by those skilled in the relevant arts based on the disclosure herein, vias can be used to electrically connect different metal layers of an IC package substrate. Vias can be formed by, e.g., directing a laser beam at the dielectric layer or drilling holes into the dielectric layer. The holes can be filled or plated with a conductive material (e.g., copper or aluminum).

In step 1306, a metal layer is applied to the dielectric layer. For example, a copper layer can be applied to the dielectric layer, e.g., through a copper tape. In a further embodiment, a metal layer can be applied to the top and bottom surfaces of the dielectric layer.

In step 1308, the metal layer can be patterned. For example, the metal layer can be patterned to form traces and pads. The pads can be used to receive connections from an IC die. The traces can be used to route these connections to other locations in the IC package substrate. A metal layer can be patterned by etching the metal layer, e.g., using a chemical, a mechanical, or a lithographic etching process.

In step 1310, it is determined whether all layers of the IC package substrate are complete. For example, an IC package substrate may include multiple metal layers. In such an embodiment, flowchart 1300 can return to step 1302 in which another dielectric layer is provided and another layer of metal can be applied thereto. By providing multiple patterned metal layers, additional routing resources can be included in the final substrate.

Figure 14:
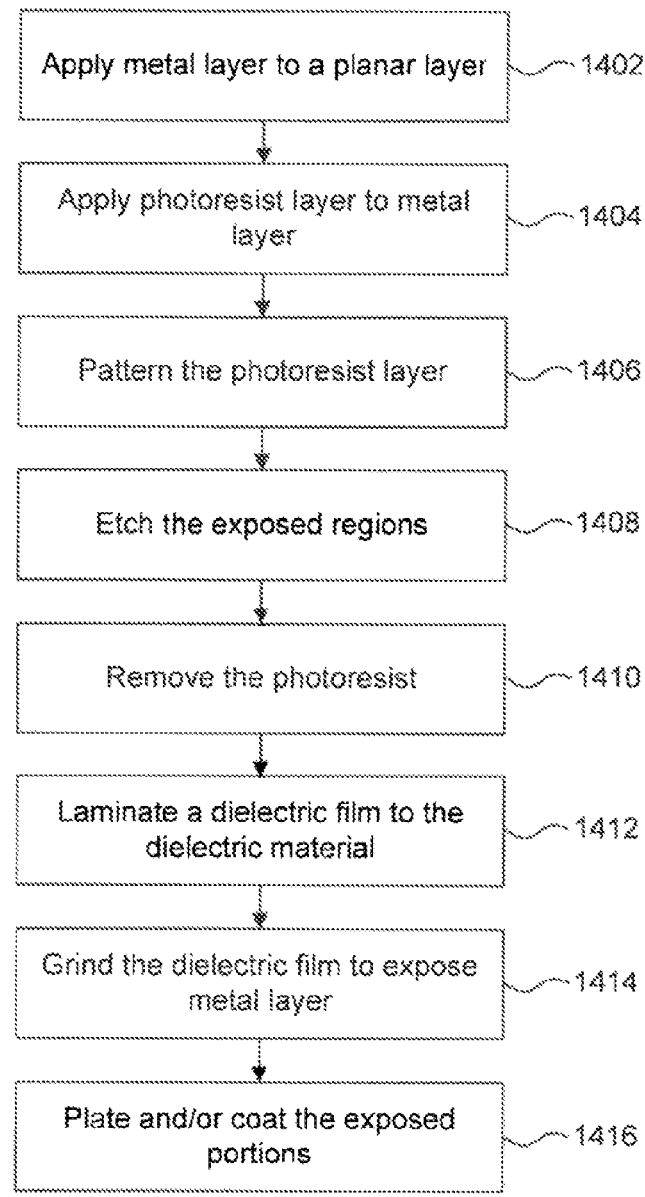
FIG. 14 shows a flowchart providing example steps for manufacturing a matrix of pillars of an IC package substrate, according to an embodiment.

FIG. 14 shows a method of forming a matrix of pillars, according to an embodiment. Not all steps of method 1400 may be required, nor do all these steps shown in FIG. 14 necessarily have to occur in the order shown. Method 1400 is described with reference to the embodiments shown in FIGS. 15A-15D, but is not limited to that embodiment.

Figure 15A:
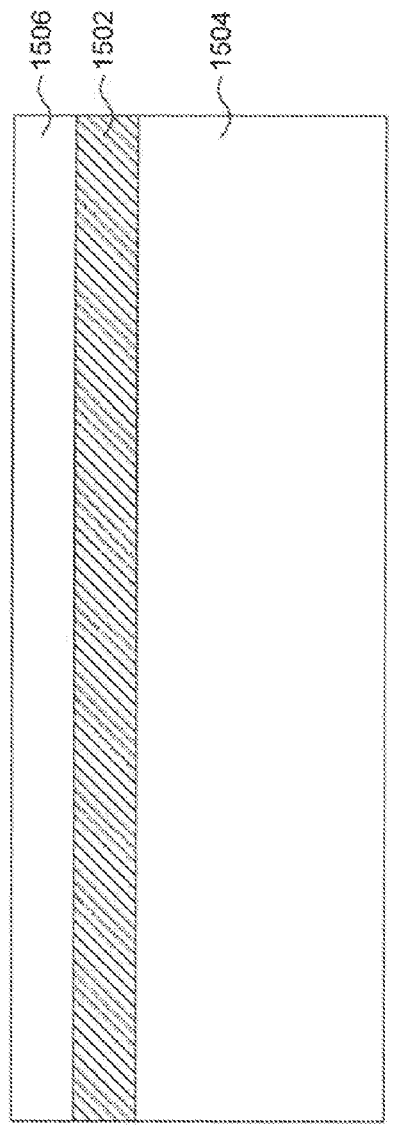

In step 1402, a metal layer is applied to a planar layer. For example, as shown in FIG. 15A, a metal layer 1502 is applied to planar layer 1504. In an embodiment, metal layer 1502 can be a copper tape. In an embodiment, planar layer 1504 can be a manufacturing carrier. A manufacturing carrier can be a solid, planer element that is used to build up other materials. The manufacturing carrier can be formed out of, e.g., metal or ceramic materials. When the metal layer is applied to a manufacturing carrier, a barrier layer can be provided between the metal layer and the manufacturing carrier. For example, the barrier layer can include a nickel and can be used to protect the metal layer during processing. A manufacturing carrier can be used, for example, when the matrix of pillars is formed before or separate of the alternating dielectric and metal layers of the IC package substrate. In an alternate embodiment, planar layer 1504 can be a layer of the IC package substrate. For example, planar layer 1504 can be a prepreg material that has a patterned metal layer formed on it. In a further embodiment, the planar layer can be the L1 metal layer of the substrate.

In step 1404, a photoresist layer is applied to the metal layer. For example, as shown in FIG. 15A, a photoresist layer 1506 is applied to metal layer 1502.

Figure 15B:
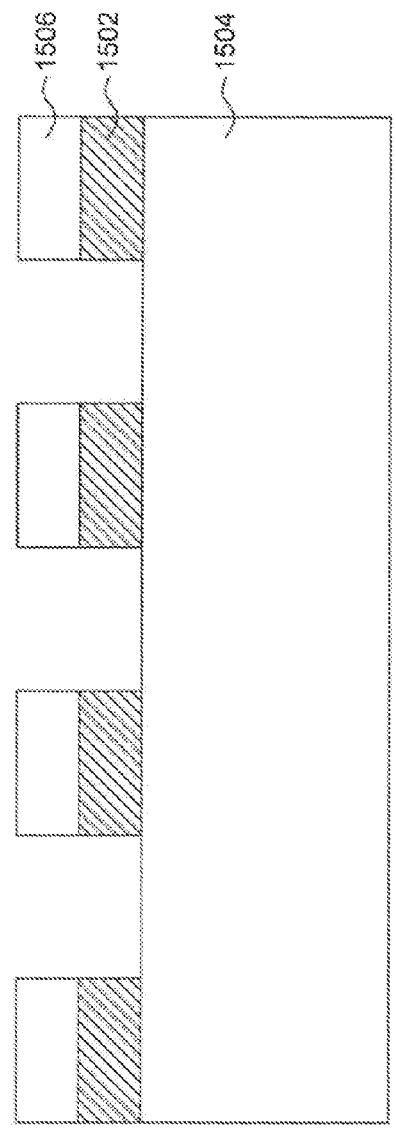

In step 1406, the photoresist layer is patterned and in step 1408, the exposed regions are etched. For example, as shown in FIG. 15B, photoresist layer 1508 can be patterned. For example, photoresist layer 1506 can be patterned using a lithographic process. The remaining exposed regions of metal layer 1502 can then be etched. The etching leaves the portions of metal layer 1502 that are protected by the remaining portions of photoresist layer 1506.

In step 1412, the layer of photoresist is removed. For example, a chemical etchant can be used to remove the photoresist layer. In another embodiment, the photoresist layer can be mechanically removed using, e.g., a grinding process.

Figure 15C:
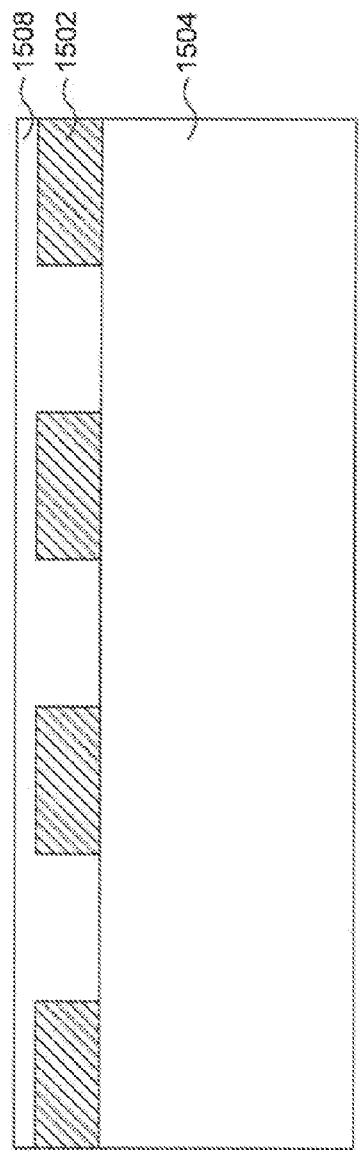

In step 1414, the planar layer is laminated with a dielectric material. For example, as shown in FIG. 15C, a film 1508 is laminated on planar layer 1504. In laminating planar layer 1504 with film 1508, the remaining portions of metal layer 1502 are disposed in film 1508. Dielectric film 1508 can be an HBI film provided by Taiyo, Inc. or other types of dielectric film. For example, dielectric film 1508 can be a solder mask material, e.g., solder mask AUS310 or solder mask AUS320 provided by Taiyo, Inc.

Figure 15D:
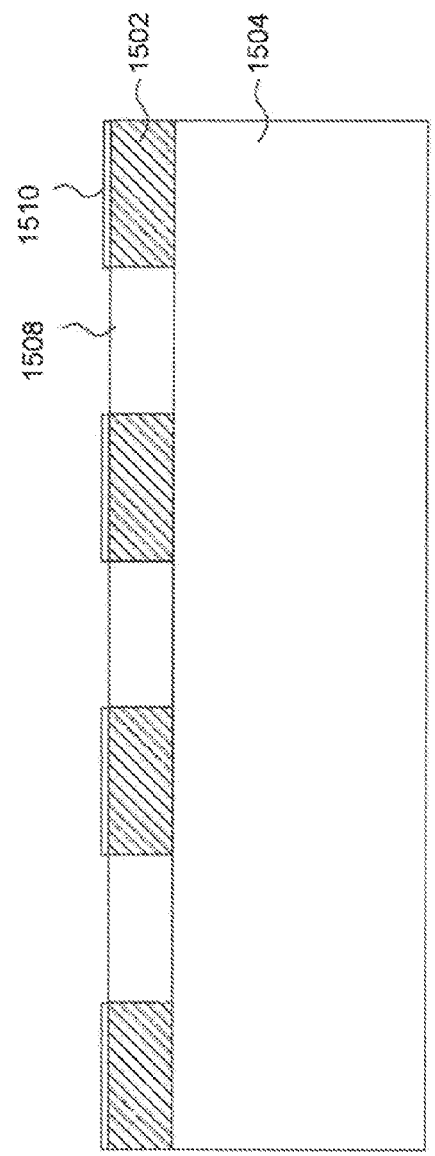
Figure 15F:
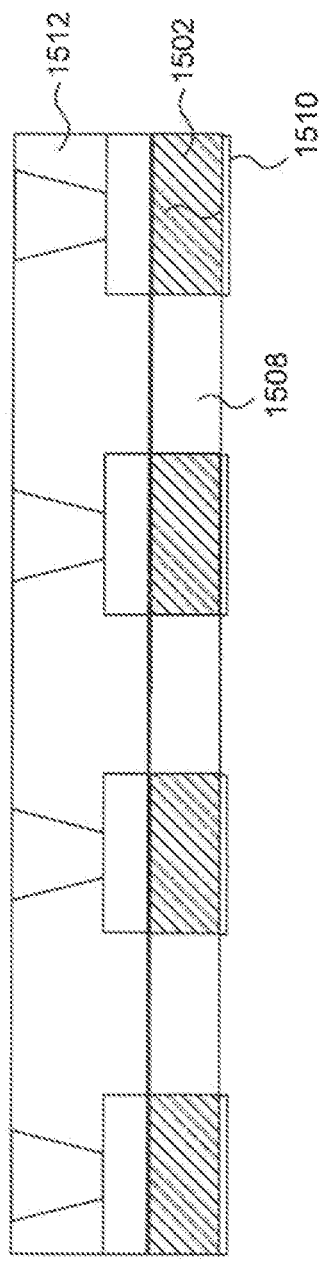

In step 1414, the dielectric film is grinded to expose the remaining patterned portions of the metal layer. For example, as shown in FIG. 15D, dielectric film 1508 is grinded such that the remaining portions of metal layer 1502 are exposed. In an embodiment, the material used for dielectric film 1508 can be chosen based on its ability to withstand a mechanical grinding process. For example, the HBI dielectric manufactured by Taiyo, Inc. can be especially suited to withstand a mechanical grinding process.

In step 1416, the exposed portions of the metal layer are plated and/or coated. For example, as shown in FIG. 15D, exposed portions of metal layer 1502 can be coated with coating 1510. Coating 1510 can be an OSP coating that prevents oxidation of the exposed regions of metal layer 1502.

As noted above, the planar layer can be a layer of the substrate or a manufacturing carrier. In the embodiment in which the planar layer is a manufacturing carrier, after the metal layer is exposed, substrate layers can be provided on the exposed metal layer. For example, in FIG. 15E, a substrate layer 1512 including a patterned L1 metal layer 1514, vias 1516, and dielectric material 1518 can be provided on metal layer 1502 and dielectric film 1508. In an embodiment, substrate layer 1512 can be formed using the steps of FIG. 13. Additional substrate layers can also be provided (e.g., two substrate layers for a 2-level substrate or four substrate layers for a 4-level substrate). The manufacturing carrier can then be removed and the remaining exposed portions of the metal layer can be coated and/or plated. For example, in FIG. 15F, planar layer 1504 is removed, and the exposed portions of metal layer 1502 are coated with coating 1510.

The steps of method 1400 provide one exemplary embodiment for forming a matrix of pillar using a "subtractive process," e.g., a process in which unused areas of a metal layer are etched away. In another embodiment, an "additive process" can be used. For example, in an additive process, a layer of photoresist can be applied to a planar layer, e.g., a manufacturing carrier or a layer of an IC package substrate. The photoresist can then be patterned (e.g., using a lithographic process) to create a matrix of openings in the photoresist layer. The openings can be filed with a metal, e.g., using metal plating process, to create the matrix of pillars. If the metal plating process results in a planar metal layer being from over the photoresist area, the metal layer can be etched such that only the metal region in the openings remain as well as the unexposed photoresist regions. The photoresist regions can then be removed by using a suitable etching process specific to the photoresist material (e.g., a chemical etching process for the particular photoresist material).

Once the photoresist layer is removed, the planar layer (e.g., manufacturing carrier) can then be laminated with a dielectric film. Portions of the dielectric film above the matrix of pillars can be removed. For example, the dielectric film can be grinded to expose the matrix of pillars. Alternatively, the alternating metal and dielectric layers of the substrate can then be formed (before laminating the manufacturing carrier), e.g., using the steps of method 1300. In such an embodiment, the manufacturing carrier can then be removed, and the surfaces of the exposed matrix of pillars can be coated with an OSP coating and/or a coating including one or more of nickel, gold, or tin. The resulting substrate can then be laminated with a dielectric film.

Figure 16:
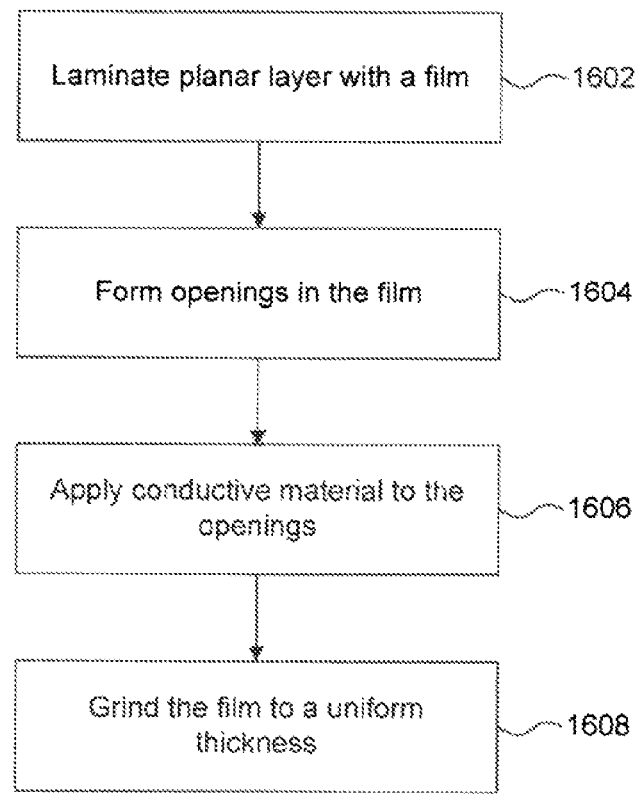
FIG. 16 shows a flowchart providing example steps for manufacturing a matrix of pillars of an IC package substrate, according to an embodiment.

FIG. 16 shows a method of forming a matrix of pillars, according to an embodiment. Not all steps of method 1600 may be required, nor do all these steps shown in FIG. 16 necessarily have to occur in the order shown. Flowchart 1600 is described with respect to the embodiments shown in FIGS. 17A-17B, but is not limited to those embodiments.

In step 1602, a planar layer is laminated with a dielectric film. In step 1604, openings are formed in the film. For example, as shown in FIG. 17A, a dielectric film is applied to planar layer 1702. Planar layer 1702 can be a manufacturing carrier or a portion of an IC package substrate (e.g., the L1 metal layer of the substrate). Openings 1706 are formed in dielectric film 1704. In an embodiment, openings 1706 can be formed using a laser that is directed to specific regions of dielectric film 1704.

In step 1606, a conductive material is applied to the openings in the film. In step 1608, the film is grinded to a uniform thickness. For example, as shown in FIG. 17B, a conductive material 1706, e.g., a metal such as copper or aluminum, is applied in opening 1708. Conductive material 1706 can be applied using, e.g., a metal deposition process. Moreover, dielectric film 1704 can be grinded to a uniform thickness.

In an alternative embodiment, in step 1606, the conductive material is applied using a plating process. As a result, the surface of the conductive material forms a planar (conductive) surface. A portion of the plated material can then be removed, leaving the matrix of pillars exposed at the surface of the dielectric film. For example, the portion of the conductive material can be removed using an etching process (e.g., mechanical, lithographic, or chemical etching process).

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. An integrated circuit (IC) package substrate, comprising:
    a dielectric layer having first and second opposing surfaces; and a matrix of pillars disposed in the dielectric layer and arranged to receive a matrix of conductive elements of an IC die, wherein each pillar of the matrix of pillars is exposed at the first surface of the dielectric layer and wherein each pillar of the matrix of pillars extends through the dielectric layer to contact a metal layer attached to the second surface of the dielectric layer, and wherein an exposed surface of each pillar of the matrix of pillars is larger in a first direction than in a second direction.

2. The IC package substrate of claim 1, wherein the exposed surface of each pillar of the matrix of pillars has a substantially oblong shape.

3. The IC package substrate of claim 1, wherein each pillar of the matrix of pillars comprises copper or aluminum.

4. The IC package substrate of claim 1, wherein each pillar of the matrix of pillars comprises an organic surface passivation material.

5. The IC package substrate of claim 1, wherein each pillar of the matrix of pillars comprises a metallic plating.

6. The IC package substrate of claim 1, wherein each pillar of the matrix of pillars is physically connected to a respective pad of the metal layer.

7. The IC package substrate of claim 1, wherein a dimension of each pillar of the matrix of pillars in the first direction is at least twice as large as a dimension of the pillar in the second direction.

8. The IC package substrate of claim 1, wherein each pillar of the matrix of pillars contacts a respective pad of the metal layer.

9. The IC package substrate of claim 8, further comprising: a via coupled to at least one pad of the metal layer.

10. The IC package substrate of claim 9, wherein the via is a plated via.

11. An integrated circuit (IC) package substrate, comprising:

a dielectric layer having first and second opposing surfaces; and a matrix of pillars disposed in the dielectric layer and arranged to receive a matrix of conductive elements of an IC die, wherein each pillar of the matrix of pillars is coupled to a respective pad of a metal layer of the IC package substrate, and wherein each respective pad is coupled to a respective via, and wherein an exposed surface of each pillar of the matrix of pillars is larger in a first direction than in a second direction.

12. The IC package substrate of claim 11, wherein the exposed surface of each pillar of the matrix of pillars has a substantially oblong shape.

13. The IC package substrate of claim 11, wherein each pillar of the matrix of pillars comprises an organic surface passivation material.

14. The IC package substrate of claim 11, wherein a dimension of each pillar of the matrix of pillars in the first direction is at least twice as large as a dimension of the pillar in the second direction.

15. An integrated circuit (IC) package substrate, comprising:

a dielectric layer having first and second opposing surfaces; and a matrix of pillars disposed in the dielectric layer and arranged to receive respective ones of conductive elements of an IC die, wherein a pitch between each pillar of the matrix of pillars matches a pitch between conductive elements of the IC die, and each pillar of the matrix of pillars is configured to be bonded to a respective one of the conductive elements of the IC die.

16. The IC package substrate of claim 15, wherein each pillar of the matrix of pillars is coupled to a respective pad of a metal layer of the IC package substrate, and wherein each respective pad is coupled to a respective via.

17. The IC package substrate of claim 15, wherein an exposed surface of each pillar of the matrix of pillars is larger in a first direction than in a second direction.

18. The IC package substrate of claim 17, wherein a dimension of each pillar of the matrix of pillars in the first direction is at least twice as large as a dimension of the pillar in the second direction.

* * * * *